(12) United States Patent
Hiroshima

(10) Patent No.: US 8,300,295 B2
(45) Date of Patent: Oct. 30, 2012

(54) THIN FILM SEMICONDUCTOR DEVICE, ELECTROOPTIC DEVICE, AND ELECTRONIC EQUIPMENT

(75) Inventor: Yasushi Hiroshima, Tatsuno-machi (JP)

(73) Assignee: Seiko Epson Corporation, Tokyo (JP)

( * ) Notice: Subject to any disclaimer, the term of this patent is extended or adjusted under 35 U.S.C. 154(b) by 199 days.

(21) Appl. No.: 12/722,868

(22) Filed: Mar. 12, 2010

(65) Prior Publication Data

US 2010/0232004 A1    Sep. 16, 2010

(30) Foreign Application Priority Data

Mar. 13, 2009  (JP) ................................. 2009-060743
Oct. 22, 2009  (JP) ................................. 2009-243207

(51) Int. Cl.
*G02F 1/03* (2006.01)
*H01L 27/12* (2006.01)

(52) U.S. Cl. .................... 359/259; 359/248; 257/351

(58) Field of Classification Search .................. 359/245, 359/248, 254, 259, 315, 316; 257/347, 351, 257/E27.062
See application file for complete search history.

(56) References Cited

U.S. PATENT DOCUMENTS 6,249,326 B1   6/2001  Hebiguchi
6,683,593 B2   1/2004  Miyatake et al.
7,012,302 B2   3/2006  Miyasaka
2004/0173796 A1  9/2004  Miyasaka
2005/0255639 A1  11/2005  Miyasaka

FOREIGN PATENT DOCUMENTS

| JP | 02-178632 A | 7/1990 |
| JP | 09-036378 | 2/1997 |
| JP | 09-045793 | 2/1997 |
| JP | 09-244068 | 9/1997 |
| JP | 09-244068 A | 3/1999 |
| JP | 11-167127 A | 6/1999 |
| JP | 2001-235721 | 8/2001 |
| JP | 2004-241700 A | 8/2004 |

*Primary Examiner* — Jack Dinh
(74) *Attorney, Agent, or Firm* — Maschoff Gilmore & Israelsen

(57) ABSTRACT

A thin film semiconductor device includes, on a substrate, a thin film transistor of which channel is N-type, and a thin film transistor of which channel is P-type, wherein a source region of the N-type thin film transistor and a source region of the P-type thin film transistor are arranged so as to be adjacent to each other at least in some region and are electrically connected to a first electrode through one contact hole formed on the some region, and a drain region of the N-type thin film transistor and a drain region of the P-type thin film transistor are arranged so as to be adjacent to each other at least in some region and are electrically connected to a second electrode through one contact hole formed on the some region.

14 Claims, 13 Drawing Sheets

THIN FILM SEMICONDUCTOR DEVICE, ELECTROOPTIC DEVICE, AND ELECTRONIC EQUIPMENT

BACKGROUND

1. Technical Field

The present invention relates to a thin film semiconductor device, an electrooptic device, and electronic equipment, particularly to a configuration of a thin film transistor.

2. Related Art

Nowadays, high definition images are often displayed in Hi-Vision (high definition television) or the like. For example, in a projector as electronic equipment, high definition images are displayed in many cases while a liquid crystal panel as an electrooptic device is used as a light modulation element (light valve).

In the liquid crystal panel used for the light valve, a quartz or the like is used as a substrate, a thin film transistor is formed on the substrate as a pixel circuit for driving liquid crystal molecules by applying a predetermined voltage to a liquid crystal for each pixel. Then, the number of pixels formed on a display region of the liquid crystal panel is increased or the number of display gradations of an image is increased in order to display a high definition image. Therefore, the thin film transistor formed on the liquid crystal panel becomes in a high-speed driving state in which a voltage application time for each pixel is short. This requires the thin film transistor to have a high-speed driving performance such that a voltage depending on the gradation of an image to be displayed can be applied to the liquid crystal for a short period of time.

As such thin film transistor used in a pixel circuit, which responds to such high speed driving, for example, JP-A-9-244068 discloses a following technique. In the technique disclosed in JP-A-9-244068, a complementary circuit (also referred to as CMOS circuit) is constituted by connecting an N-type channel thin film transistor and a P-type channel thin film transistor in parallel. In the technique disclosed in JP-A-9-244068, a pixel circuit which responds to high speed driving can be formed by constituting the CMOS circuit as described above.

However, the number of contact holes to be formed, which are connected to semiconductor layers of the thin film transistors, is increased from two to four by forming and arranging the two thin film transistors of N-type channel and P-type channel in each pixel. This results in increase in a planar area occupied by the thin film transistors. Therefore, there arises the following problem. That is, spaces between signal lines or those between scan lines cannot be narrower. Accordingly, it is difficult that a high definition image is displayed by making pixel regions smaller and the number of pixels larger. Note that the pixel regions are compartment-formed by the signal lines and the scan lines.

SUMMARY

Application Example 1

A thin film semiconductor device includes, on a substrate, a thin film transistor of which channel is N-type, and a thin film transistor of which channel is P-type. In the thin film semiconductor device, a source region of the N-type thin film transistor and a source region of the P-type thin film transistor are arranged so as to be adjacent to each other at least in some region and are electrically connected to a first electrode through one contact hole formed on the some region, and a drain region of the N-type thin film transistor and a drain region of the P-type thin film transistor are arranged so as to be adjacent to each other at least in some region and are electrically connected to a second electrode through one contact hole formed on the some region.

Normally, contact holes connecting a source region and a source electrode and connecting a drain region and a drain electrode are formed in each of the thin film transistors. Accordingly, four contact holes are required. However, with the above configuration, each of electrical connections between two source regions and two source electrodes and between two drain regions and two electrodes can be made with one contact hole respectively in the two thin film transistors. Accordingly, increase in the number of the contact holes is suppressed. Therefore, area of the connection portions can be smaller so that the area occupied by the two thin film transistors can be small. As a result, the number of pixels is increased so that the high definition image can be displayed.

Application Example 2

In the above thin film semiconductor device, a plurality of signal lines which are extended in a predetermined direction and a plurality of first scan lines and second scan lines which are extended in parallel in a direction perpendicular to the signal lines are formed on the substrate, one of the first electrode and the second electrode is a unit electrode formed on a region defined by the signal line and the first scan line and the second scan line or an electrode connected to the unit electrode, and the other of the first electrode and the second electrode is the signal line.

With this configuration, a voltage applied to the signal line depending on the gradation of an image to be displayed can be applied to the unit electrode for a short period of time by the thin film transistors of N-type and P-type constituting a complementary circuit. Therefore, a pixel circuit which responds to high speed driving can be formed.

Application Example 3

In the above thin film semiconductor device, a gate electrode of the N-type thin film transistor is electrically connected to the first scan line and a gate electrode of the P-type thin film transistor is electrically connected to the second scan line, and the gate electrode of the N-type thin film transistor and the gate electrode of the P-type thin film transistor are formed while being offset in the direction where the first scan line or the second scan line is extended.

With this configuration, the gate electrodes are not opposed to each other in the normal line direction of the first scan line or the second scan line. Therefore, the region length of the thin film transistors in the normal line direction of the first scan line or the second scan line can be smaller. Accordingly, regions occupied by the two thin film transistors can be smaller in the normal line direction of the first scan line or the second scan line. Therefore, the number of pixels in the normal line direction can be increased.

Application Example 4

An electrooptic device has, for each pixel, a pixel electrode to which a voltage or a current is applied, and displays an image by electrooptic conversion in which a voltage change or a current change is converted to an optical change. The electrooptic device includes the thin film semiconductor device described above. Further, in the electrooptic device, the unit electrode in the thin film semiconductor device is formed as the pixel electrode.

With this configuration, even in the electrooptic device having a large number of pixels, for example, a voltage applied to the signal line can be applied to the pixel electrode for a short period of time. Accordingly, a high definition image can be displayed.

Application Example 5

In the electrooptic device, the pixel is a sub-pixel of which display color is red, green, or blue and which is formed such that the display colors are arranged in a predetermined order in the direction where the signal lines are extended.

With this configuration, a liquid crystal panel capable of high definition color image display can be realized.

Application Example 6

In the electrooptic device, the pixel electrode is a reflection electrode which reflects light.

With this configuration, a reflection liquid crystal panel with a high definition image display can be realized.

Application Example 7

In the electrooptic device, the thin film semiconductor device is set as one substrate, an opposed substrate which is arranged so as to be opposed to the one substrate is set as the other substrate, and a liquid crystal layer is held between the one substrate and the other substrate in a sandwiched manner.

With this configuration, a liquid crystal panel capable of high definition image display can be realized.

Application Example 8

Electronic equipment includes the above electrooptic device.

With this configuration, an electronic equipment with a high definition image display can be realized.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
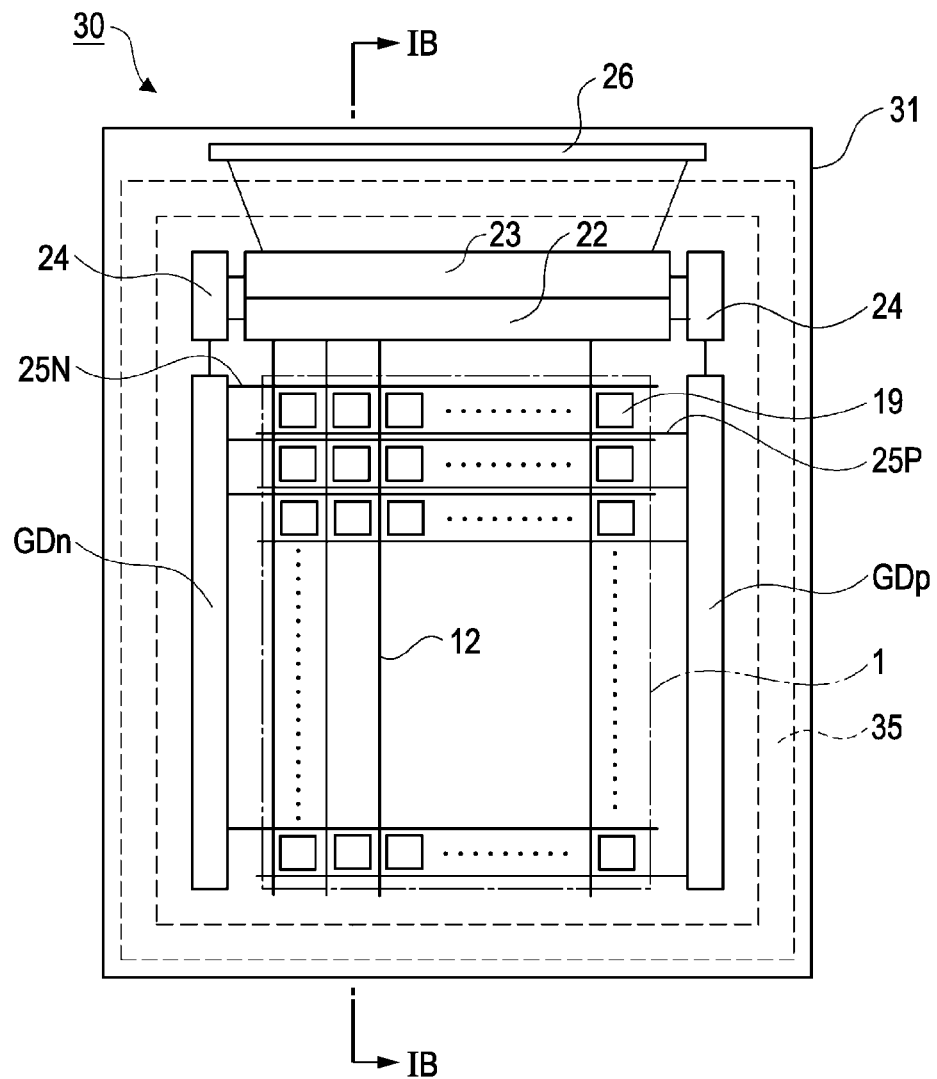
FIG. 1A is a plan view illustrating a liquid crystal panel according to an embodiment of the invention as an electrooptic device including a thin film semiconductor device.

Hereinafter, the invention is described by using embodiments. Drawings used in the following description are shown in a state where scales thereof are different from actual scales in some case for the sake of simple explanation. It is needless to say that components are not always shown in actual dimensions in the drawings.

First Embodiment

Electrooptic Device

Figure 1B:
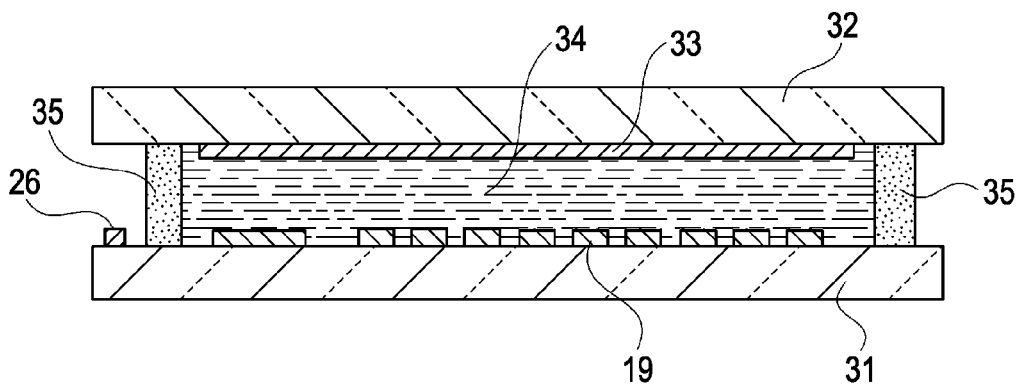
FIG. 1B is a cross-sectional view illustrating the liquid crystal panel according to an embodiment of the invention as the electrooptic device including the thin film semiconductor device.

FIGS. 1A and 1B show a liquid crystal panel according to an embodiment as an electrooptic device including a thin film semiconductor device to which the invention is applied. FIG. 1A is a plan view illustrating the liquid crystal panel according to the embodiment. FIG. 1B is a cross-sectional view cut along a line IB-IB in FIG. 1A.

As shown in FIGS. 1A and 1B, in a liquid crystal panel 30 according to the embodiment, a display region 1 is formed on an element substrate 31 of which base is a quartz substrate or the like. In the display region 1, pixel electrodes 19 are arranged in a matrix form. A signal line driving circuit 22, a first scan line driving circuit GDn and a second scan line driving circuit GDp are formed on the periphery of the display region 1. The signal line driving circuit 22 outputs data signals, and the first scan line driving circuit GDn and the second scan line driving circuit GDp output gate signals. A pad region 26, an input circuit 23 and a timing control circuit 24 are provided on the element substrate 31.

The timing control circuit 24 outputs an image signal corresponding to image data to the signal line driving circuit 22, the first scan line driving circuit GDn and the second scan line driving circuit GDp to control the image signal. The image data is input from the outside through the pad region 26 and loaded by the input circuit 23. Then, gate signals are sequentially output from the first scan line driving circuit GDn and the second scan line driving circuit GDp to scan lines 25N and scan lines 25P, respectively. Data signals are output from the signal line driving circuit 22 to signal lines 12 at a predetermined time interval.

As shown in FIG. 1B, the liquid crystal panel 30 includes the element substrate 31 and a transparent opposed substrate 32 which are arranged at a constant space. The above pixel electrodes 19, circuits such as the signal line driving circuit 22, and the like are formed on the element substrate 31. A transparent opposed electrode 33 is provided on the transparent opposed substrate 32. A liquid crystal 34 of vertical alignment (VA) type or the like is filled into a space of which peripheries are sealed with sealing materials 35. The pad region 26 is arranged outside the sealing materials 35 such that signals such as image data are input from the outside to the pad region 26. The pixel electrodes 19 are reflection electrodes which reflect light in the embodiment.

The liquid crystal panel 30 configured as described above applies a voltage which is a data signal supplied to each signal line 12 to each pixel electrode 19 with switching operations by the thin film transistors formed on each pixel electrode 19. An electric field is generated between the pixel electrodes 19 and the opposed electrode 33 having a common potential so that the liquid crystal panel 30 displays an image by modulating a transmissivity of the liquid crystal 34. Accordingly, a plurality of pixels in correspondence to the pixel electrodes 19 and the opposed electrode 33 are formed on the liquid crystal panel 30.

Figure 2:
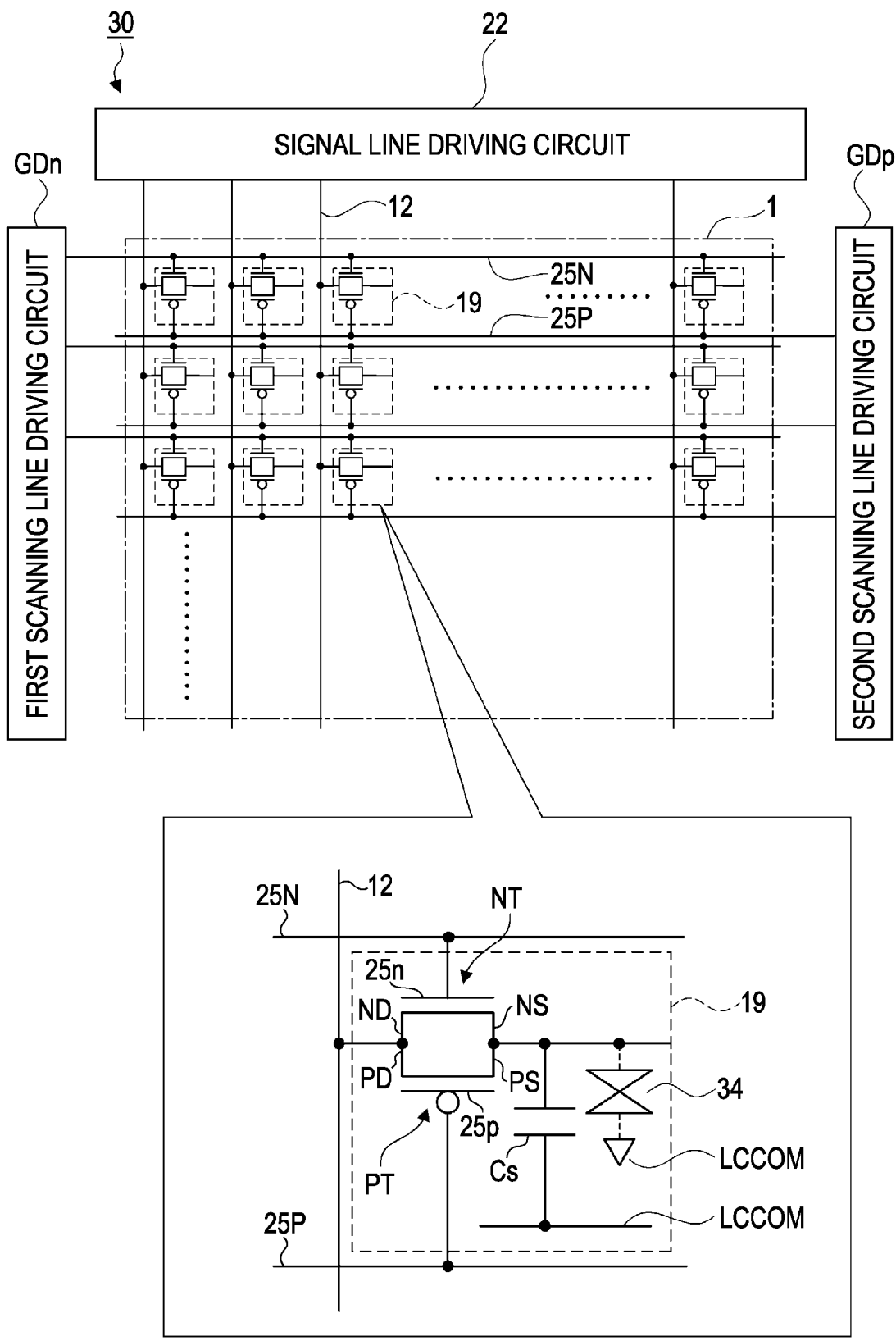
FIG. 2 is a schematic view illustrating a circuit portion relating to driving of pixels in the liquid crystal panel.

The thin film transistors formed on each pixel electrode 19 is described with reference to FIG. 2. FIG. 2 is a schematic view illustrating a circuit (also referred to as "pixel circuit") portion relating to driving of pixels in the liquid crystal panel 30. An enlarged portion in FIG. 2 shows a circuit diagram in which a pixel circuit for one pixel is illustrated with an equivalent circuit.

As shown in FIG. 2, pixels are arranged in regions surrounded by the signal lines 12 and the scan lines 25N and 25P. Each pixel has the pixel electrode 19, a thin film transistor of which channel region is N-type (hereinafter, simply referred to as "N-type thin film transistor") NT and a thin film transistor of which channel region is P-type (hereinafter, simply referred to as "P-type thin film transistor") PT. As described above, data signals output from the signal line driving circuit 22 are applied to the signal lines 12, gate signals output from the first scan line driving circuit GDn are applied to the scan lines 25N, and gate signals output from the second scan line driving circuit GDp are applied to the scan lines 25P. At this time, a potential (voltage) of the gate signal applied to the scan lines 25N is in the opposite relation to a potential (voltage) of the gate signal applied to the scan lines 25P. For example, if the potential of the gate signal applied to the scan lines 25N is "5V", the potential of the gate signal applied to the scan lines 25P is "0V". In contrast, if the potential of the gate signal applied to the scan lines 25N is "0V", the potential of the gate signal applied to the scan lines 25P is "5V".

As shown in the enlarged portion in FIG. 2, a pixel circuit is formed on one pixel. In the pixel circuit, a CMOS circuit in which the N-type thin film transistor NT and the P-type thin film transistor PT are connected in parallel and combined is formed as a switching element. The scan line 25N is connected to a gate electrode 25n of the N-type thin film transistor NT, and the scan line 25P is connected to a gate electrode 25p of the P-type thin film transistor PT. On the other hand, the signal line 12 is connected to a drain region ND of the N-type thin film transistor NT and a drain region PD of the P-type thin film transistor PT. A source region NS of the N-type thin film transistor NT and a source region PS of the P-type thin film transistor PT are connected to one electrode of a pixel capacitor Cs formed in correspondence to the pixel and the pixel electrode 19. Note that the other electrode of the pixel capacitor Cs is connected to a common potential LCCOM in the element substrate 31. Further, the voltage applied to the pixel electrode 19 is applied to the liquid crystal 34 by generating a predetermined electric field between the pixel electrode 19 and the opposed electrode 33 having the common potential LCCOM. Therefore, the element substrate 31 according to the embodiment corresponds to a thin film semiconductor device according to an aspect of the invention including the thin film transistor PT of which channel region is P-type and the thin film transistor NT of which channel region is N-type.

In the embodiment, source regions and drain regions are defined in the N-type thin film transistor NT and the P-type thin film transistor PT as described above for convenience of explanation. However, it is needless to say that the source regions and the drain regions are defined depending on potentials which are applied to these regions in the N-type thin film transistor NT and the P-type thin film transistor PT, as is well known.

Since the liquid crystal panel 30 according to the embodiment is a reflection panel in which the pixel electrodes 19 are reflection electrodes, each pixel electrode 19 is configured to cover the pixel circuit. Therefore, not an existing pixel circuit having one transistor and one capacitor (1T1C) but a pixel circuit having two transistors and one capacitor (2T1C) by using the CMOS circuit can be formed by using the entire area of a region at which each pixel electrode 19 is formed. As a result, a data signal can be written to the pixel capacitor Cs by using ON states of the N-type thin film transistor NT and the P-type thin film transistor PT. This makes it possible to sufficiently respond to high speed driving even when the thin film transistors in which polycrystal silicon having relatively low mobility and ON-state current is used for the semiconductor layers are employed.

To be more specific, an operation of the pixel circuit according to the embodiment which responds to high speed driving is described with reference to FIG. 3. It is assumed that a data signal "5V" is written from the signal line 12 to a state where the potentials of the pixel capacitor Cs and the liquid crystal 34 are "0V", for example. It is to be noted that a threshold value of the N-type thin film transistor NT used in this case is set to "1V" and that of the P-type thin film transistor PT is set to "−1V".

Figure 3A:
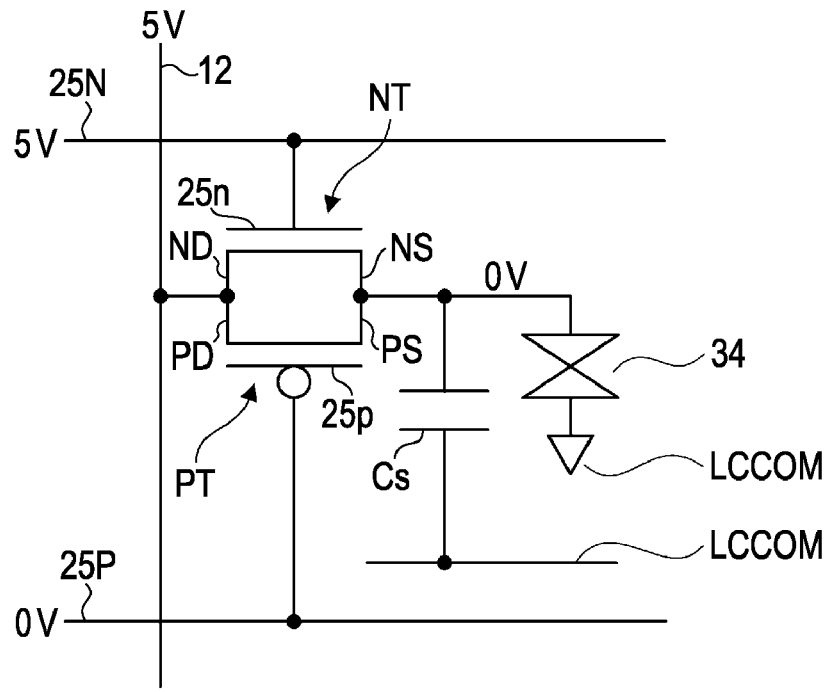
FIG. 3A is a diagram explaining an operation of a pixel circuit at an initial voltage state according to an aspect of the invention.

At first, as shown in FIG. 3A, a potential of the scan line 25N is set to "5V" and that of the scan line 25P is set to "0V". Therefore, in the N-type thin film transistor NT, a potential of the gate electrode 25n is "5V" which is equal to the potential of the scan line 25N, with respect to a source region NS (=0V). This is a high potential which is higher than the threshold value so that the N-type thin film transistor NT becomes in the ON state. Then, the signal is written to the pixel capacitor Cs from the signal line 12 and the potential of the pixel capacitor Cs increases toward "5V" from "0V".

Figure 3B:
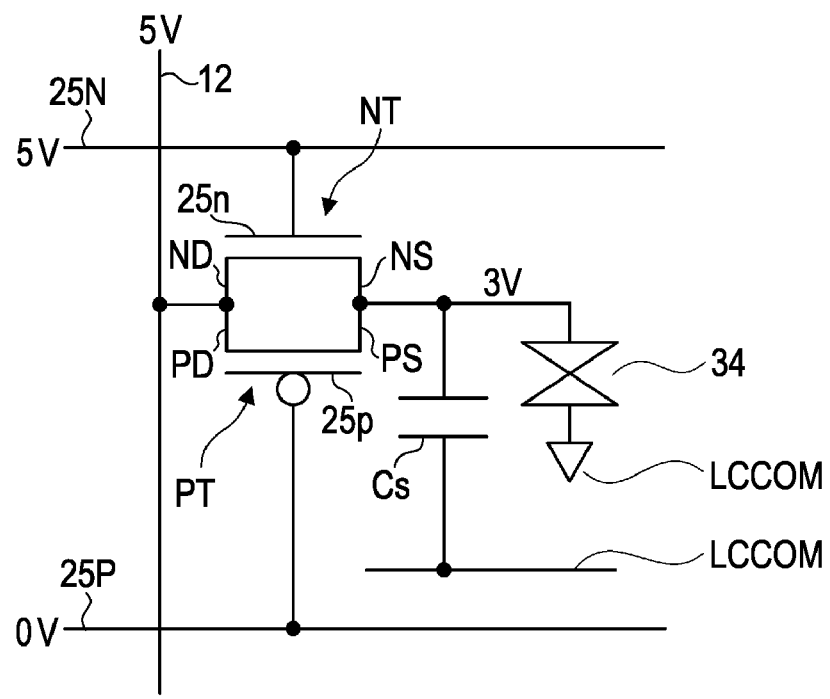
FIG. 3B is a diagram explaining an operation of the pixel circuit at an intermediate voltage state according to an aspect of the invention.

As the potential of the pixel capacitor Cs increases, a potential difference between the source region NS and the gate electrode 25n decreases. For example, as shown in FIG. 3B, when the potential of the pixel capacitor Cs increases to "3V", the potential difference between "5V" at the gate electrode 25n and "3V" at the source region NS is "2V". The potential difference "2V" is a voltage which is close to the threshold value potential "1V". Therefore, a current flowing through the N-type thin film transistor NT decreases. That is to say, in the N-type thin film transistor NT, the writing speed of the data signal to the pixel capacitor Cs is significantly decreased as the potential of the pixel capacitor Cs increases.

On the other hand, in the P-type thin film transistor PT connected in parallel with the N-type thin film transistor NT, the potential of the source region PS is equal to that of the pixel capacitor Cs. As described above, when the potential of the pixel capacitor Cs increases to "3V", the potential of the gate electrode 25p is "−3V" at the time where the potential "3V" of the source region PS is set as a reference. That is to say, the potential of the gate electrode 25p of the P-type thin film transistor PT exceeds the threshold value as the potential of the pixel capacitor Cs increases. Then, the P-type thin film transistor PT becomes in the ON state instead of the N-type thin film transistor NT. This makes it possible to write the data signal to the pixel capacitor Cs from the signal line 12, that is, from the drain region PD.

In the pixel circuit of "1T1C" which is the most simple configuration, the number of elements is small so that the pixel circuit having a small area can be realized. However, the data signal has to be written to the pixel capacitor Cs by using one thin film transistor during from an ON state to an OFF state. Therefore, the pixel circuit cannot respond to high speed driving unless the thin film transistor has an extremely high performance. In contrast, in the pixel circuit of "2T1C" in which the N-type thin film transistor NT and the P-type thin film transistor PT are connected in parallel as in the embodiment, the pixel circuit uses ON states of each thin film transistor. Therefore, the pixel circuit can respond to high speed driving even when the thin film transistors such as a polycrystal silicon film having relatively low characteristics including crystal defects are used.

In the embodiment, it is devised so that an area occupied by the CMOS circuit in which the N-type thin film transistor NT and the P-type thin film transistor PT are connected in parallel is not increased. Thus, the CMOS circuit can be formed within a region where the pixel electrode 19 is formed even in the case where an area of the pixel electrode 19 is decreased in order for a high definition image be displayed on the liquid crystal panel 30, for example.

Figure 4A:
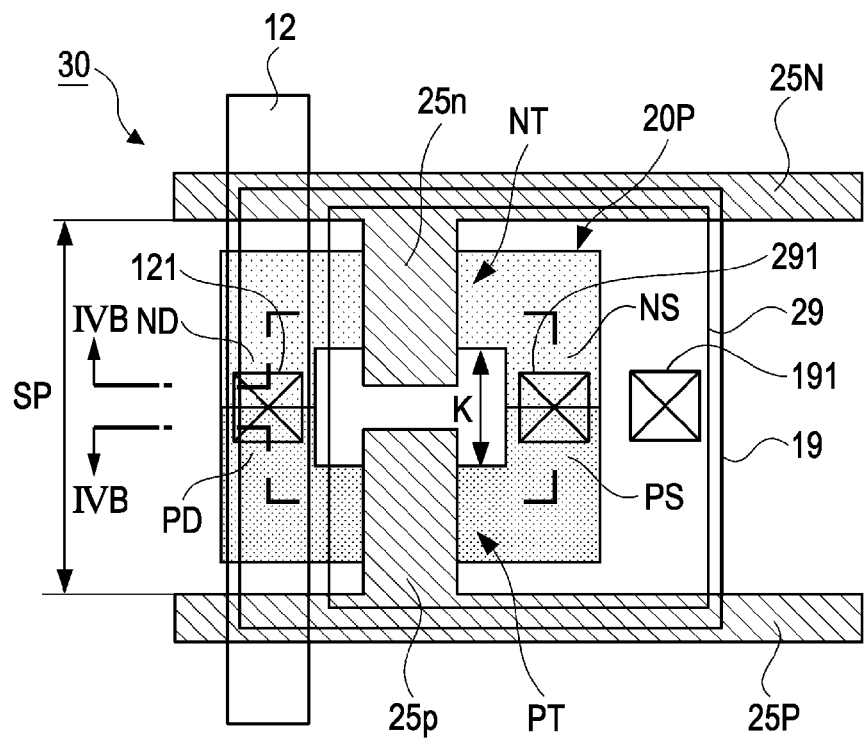
FIG. 4A is a plan view schematically illustrating a formation state of the pixel circuit according to an aspect of the invention.
Figure 4B:
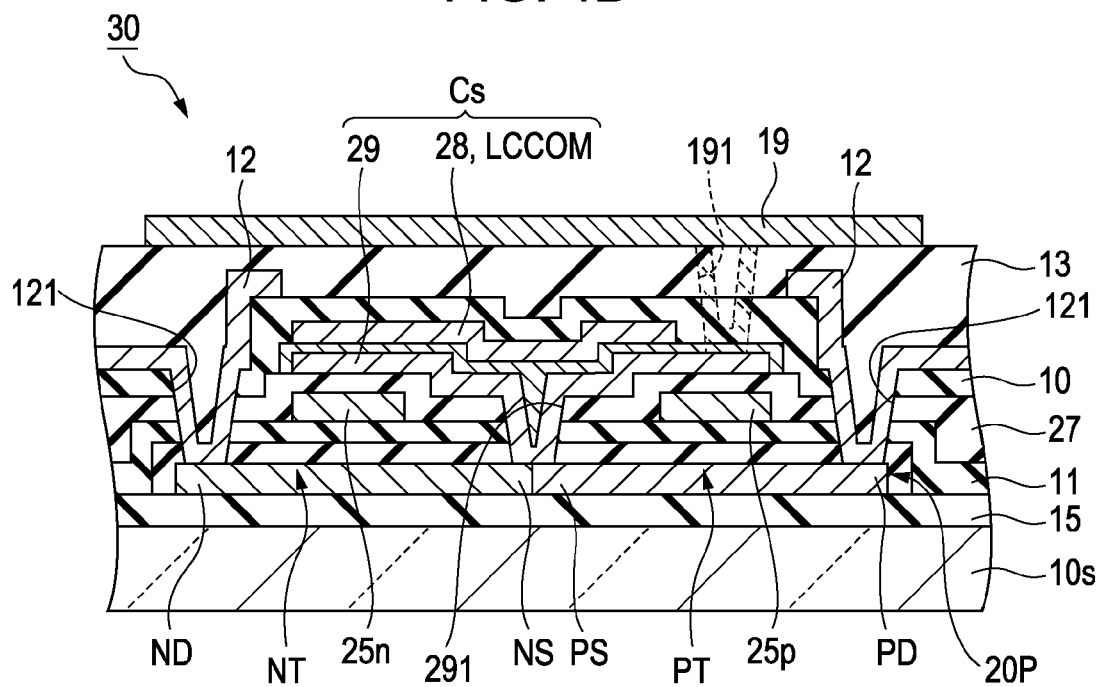
FIG. 4B is a cross-sectional view schematically illustrating a main cross-section of the pixel circuit.

A formation state of the CMOS circuit formed in the embodiment is described with reference to FIGS. 4A and 4B. FIG. 4A is a plan view schematically illustrating a formation state of the pixel circuit including the CMOS circuit according to the embodiment. FIG. 4B is a cross-sectional view cut along a line IVB-IVB in FIG. 4A and is a view schematically illustrating a main cross-section of the pixel circuit including a configuration portion of the CMOS circuit.

As shown in FIG. 4A, the N-type thin film transistor NT and the P-type thin film transistor PT are arranged so as to be opposed to each other in the embodiment. To be more specific, the drain region ND of the N-type thin film transistor NT is arranged so as to be partly adjacent to the drain region PD of the P-type thin film transistor PT. Further, the source region NS of the N-type thin film transistor NT is arranged so as to be partly adjacent to the source region PS of the P-type thin film transistor PT.

One contact hole 121 is formed on the adjacent portion of the drain region ND and the drain region PD so that the drain region ND and the drain region PD are electrically connected together to the signal line 12. In addition, one contact hole 291 is formed on the adjacent portion of the source region NS and the source region PS so that the source region NS and the source region PS are electrically connected together to the capacitor electrode 29. The capacitor electrode 29 is one of electrodes constituting the pixel capacitor Cs. It is to be noted that the capacitor electrode 29 is electrically connected to the pixel electrode 19 through a contact hole 191.

In the cross-section, as shown in FIG. 4B, the N-type thin film transistor NT and the P-type thin film transistor PT are formed on an insulation film 15 and covered by a gate insulation film 11 on the element substrate 31. The insulation film 15 is formed on a base 10s. The gate electrodes 25n, 25p are formed on the gate insulation film 11. An interlayer insulation film 27 is formed on the gate electrodes 25n, 25p so as to cover the gate electrodes 25n, 25p. The capacity electrode 29 provided on the interlayer insulation film 27 and the source region NS and the source region PS are electrically connected through the contact hole 291. The contact hole 291 is provided so as to penetrate through the gate insulation film 11 and the interlayer insulation film 27. Accordingly, the pixel electrode 19 corresponds to either one of a first electrode or a second electrode according to an aspect of the invention.

The pixel capacitor Cs is formed between the capacitor electrode 29 and the common electrode 28 having the common potential (LCCOM). The capacitor electrode 29 and the common electrode 28 sandwich an insulation layer which is formed on the capacitor electrode 29. A second interlayer insulation film 10 is formed on the common electrode 28. Further, the signal line 12 is formed on the second interlayer insulation film 10. The signal line 12 is electrically connected to both the drain region ND and the drain region PD through the contact hole 121. The contact hole 121 is provided so as to penetrate through the gate insulation film 11, the interlayer insulation film 27 and the second interlayer insulation film 10. Accordingly, the signal line 12 corresponds to the other one of the first electrode or the second electrode according an aspect of the invention.

A third interlayer insulation film 13 is formed on the signal line 12 and the second interlayer insulation film 10. The pixel electrode 19 is formed on the third interlayer insulation film 13. The pixel electrode 19 is positioned so as not to be overlapped with the common electrode 28 in a plane. Further, the pixel electrode 19 is electrically connected to the capacitor electrode 29 provided on the interlayer insulation film 27 through the contact hole 191. The contact hole 191 is provided so as to penetrate through the insulation layer, the second interlayer insulation film 10 and the third interlayer insulation film 13.

With this configuration, in the CMOS circuit configuration, each of the electrical connection between the drain region ND and the drain region PD and the signal line 12 and the electrical connection between the source region NS and the source region PS and the pixel electrode 19 can be made through one contact hole. In the CMOS circuit configuration, the two thin film transistors NT, PT are arranged in parallel.

Figure 5:
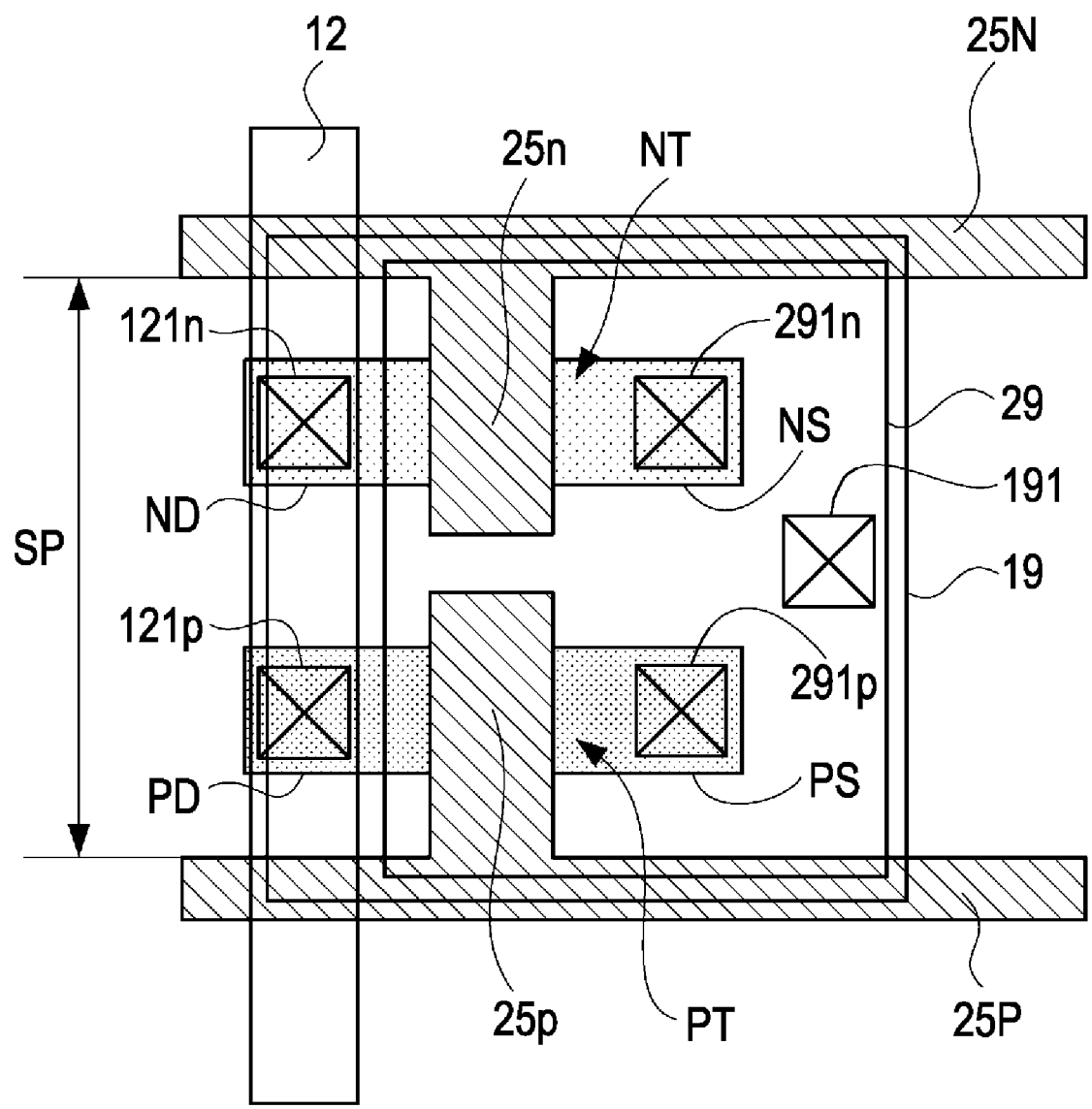
FIG. 5 is a plan view schematically illustrating a formation state of the pixel circuit including an existing CMOS circuit.

As a comparative example, an existing configuration is described with reference to FIG. 5 in the case where the two thin film transistors NT, PT are provided. FIG. 5 is a plan view schematically illustrating a formation state of a pixel circuit including the existing CMOS circuit as the comparative example. As shown in FIG. 5, the two thin film transistors NT, PT are arranged in parallel. Contact holes are formed for each of the source regions and the drain regions of the two thin film transistors NT, PT for connecting. That is to say, a contact hole 121n connecting the drain region ND and the single line 12, a contact hole 121p connecting the drain region PD and the signal line 12, a contact hole 291n connecting the source region NS and the capacitor electrode 29 and a contact hole 291p connecting the source region PS and the capacitor electrode 29 are formed. Accordingly, four contact holes in total have been required to be formed in the past. This results in increase in the occupied region for forming the contact holes. Therefore, the area occupied by the connection portions between the electrodes cannot be smaller. As a result, an area occupied by the pixel circuit having the CMOS circuit cannot be smaller. Accordingly, it has been difficult to realize high definition pixels because a space SP between each scan line 25N and each scan line 25P becomes large.

On the other hand, in the embodiment, the two drain regions ND, PD can be connected to the signal line 12 through one contact hole and the two source regions NS, PS can be connected to the capacitor electrode 29 (pixel electrode 19)

through one contact hole. That is to say, since required contact holes for the two thin film transistors NT, PT are only two, the occupied region for forming the contact holes can be smaller. Therefore, the area occupied by the pixel circuit having the CMOS circuit can be smaller. This makes it possible to realize high definition pixels by forming the space SP between each scan line 25N and each scan line 25P to be narrower, for example.

Element Substrate (Thin Film Semiconductor Device)

Next, a configuration of the element substrate 31 according to the embodiment which functions as a thin film semiconductor device is described with reference to FIGS. 6A to 8D while a method of manufacturing the thin film transistors to be formed on the element substrate 31 is described.

Figure 6A:
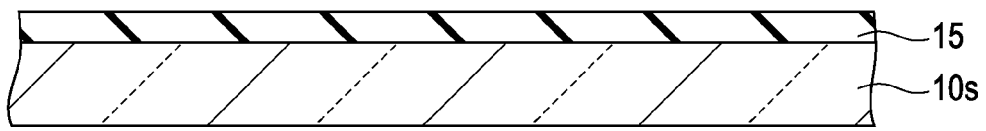
FIGS. 6A to 6E are views illustrating a manufacturing method and a configuration of the thin film transistors.

At first, as shown in FIG. 6A, the base 10s (for example, a quartz substrate having a thickness of about 1.1 mm) is prepared, and the insulation film (for example, a silicon oxide film) 15 serving as a foundation is deposited and formed on the base 10s with a plasma chemical vapor deposition (CVD) method.

Figure 6B:
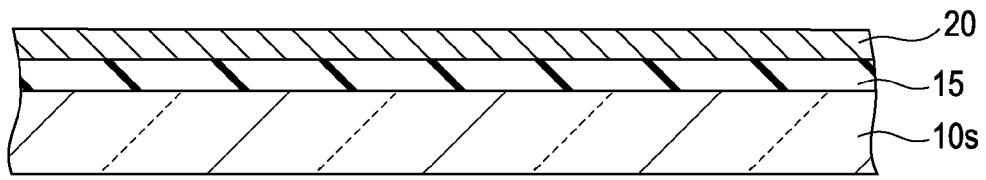

Next, as shown in FIG. 6B, a silicon film 20 as a semiconductor layer is deposited and formed on the entire surface of the insulation film 15. To be more specific, a deposition method of the silicon film 20 is a Low Pressure-Chemical Vapor Deposition (LPCVD) method or the plasma CVD method. And the silicon film 20 has a film thickness of about 50 nm to 70 nm.

Figure 6C:
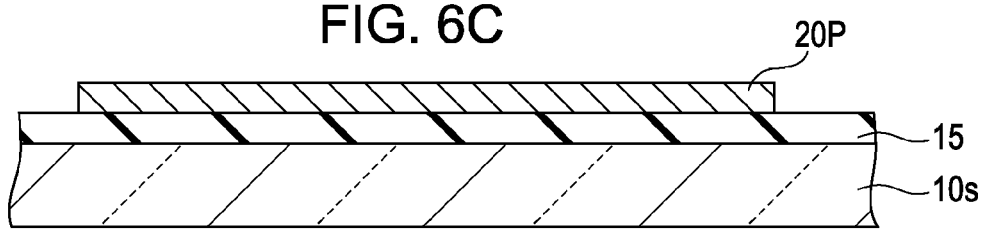

Then, predetermined preprocessings are performed. The predetermined preprocessings include crystallization of the silicon film 20, oxygen plasma irradiation with respect to the crystallized silicon film 20, removal of the silicon oxide film formed by the oxygen plasma irradiation, and the like. By performing the preprocessings, the silicon film 20 can be stably etched at the time of patterning and an appropriate boundary surface can be formed between the silicon film 20 and a gate insulation film as described later at the time of forming the gate insulation film. Subsequently, as shown in FIG. 6C, the silicon film 20 is patterned into a silicon film 20P having a predetermined shape (see, FIG. 4A) with a photolithography method. It is noted that the predetermined shape is a shape such that the silicon film 20P communicates with (is continuous to) the N-type thin film transistor NT and the P-type thin film transistor PT.

Figure 6D:
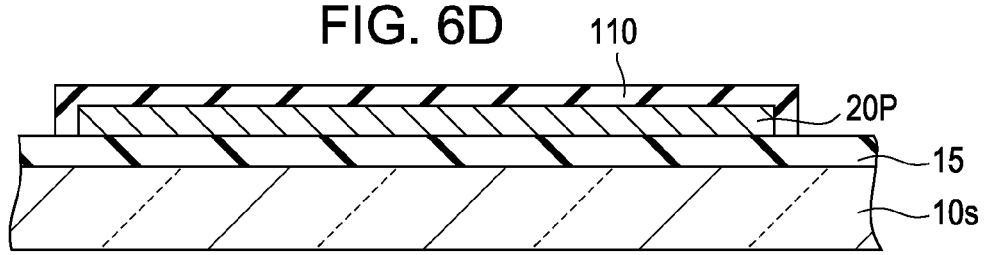

Then, as shown in FIG. 6D, a thermal oxide film 110 as the gate insulation film is formed on the patterned silicon film 20P. A method of forming the thermal oxide film 110 is as follows. That is, a surface of the silicon film 20P is oxidized at 800° C. to 1000° C. so as to form the thermal oxide film. With this method, the surface of the silicon film 20P after the oxidized silicon film is removed at the above preprocessing is oxidized so that an appropriate boundary surface between the silicon film and the gate insulation film is formed.

Figure 6E:
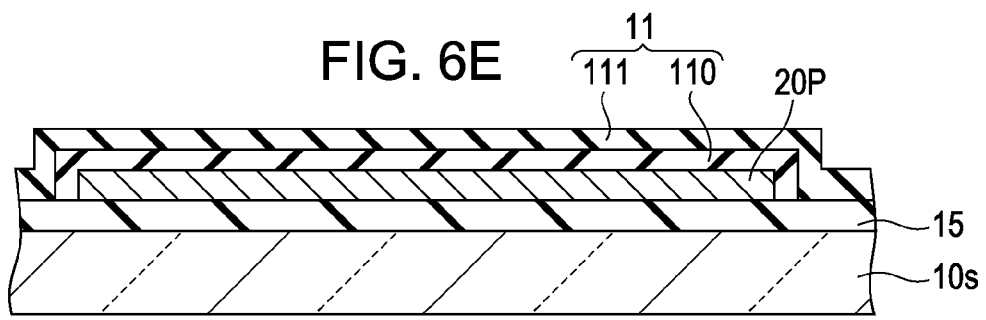

In the embodiment, as shown in FIG. 6E, the gate insulation film 11 is formed by further depositing the silicon oxide film 111 with the plasma CVD method in addition to the formation of the thermal oxide film 110. When the polycrystal silicon film is thermally oxidized for a long period of time, a number of convexes are formed on the surface of the silicon film so that a pressure resistance of the gate insulation film is lowered in some case. Then, it is desirable that after an excellent interface is formed at the thermal oxidation process for a relatively short period of time, the oxidized silicon film is deposited to form the gate insulation film 11 having a desired film thickness. In this case, after the thermal oxide film 110 having a film thickness of about 10 nm is formed by thermal oxidation for about 10 minutes at 930° C., the silicon oxide film 111 having a film thickness of 15 nm is deposited with the CVD method. Therefore, the gate insulation film 11 having the film thickness of 25 nm is formed.

Figure 7A:
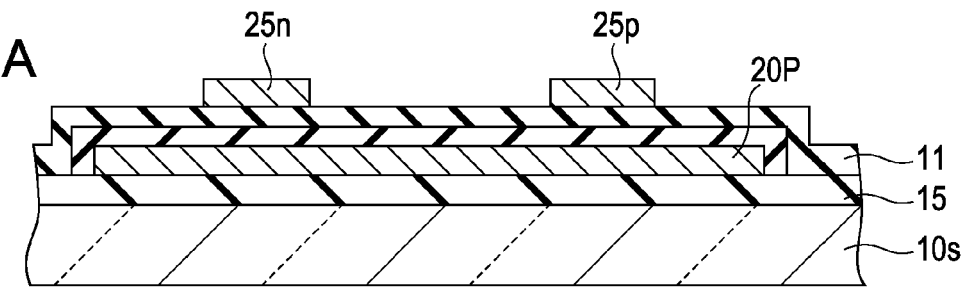
FIGS. 7A to 7D are views illustrating a manufacturing method and a configuration of the thin film transistors.

Subsequently, as shown in FIG. 7A, the gate electrodes 25n, 25p are formed on the gate insulation film 11 by depositing and patterning a conductive film. As a material of the conductive film, for example, such as impurity-doped polycrystal silicon or metallic tantalum (Ta) can be used. The conductive film can be formed from these materials by the CVD method or a sputtering method, for example. It is to be noted that the scan line 25N and the scan line 25P connected to the gate electrode 25n and the gate electrode 25p may be also patterned at the same time when the gate electrodes 25n, 25p are patterned.

Figure 7B:
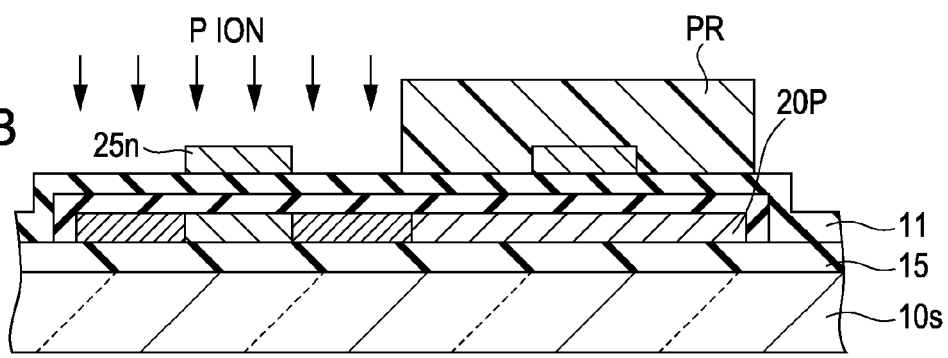
Figure 7C:
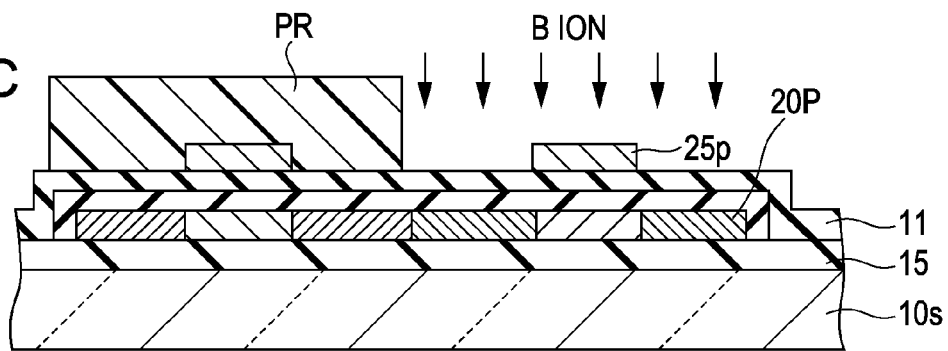

Then, as shown in FIGS. 7B and 7C, impurities are injected into the silicon film 20P at both sides of each of the gate electrodes 25n, 25p of the N-type thin film transistor NT and the P-type thin film transistor PT while the photoresist PR and the gate electrodes 25n, 25p are set as masks. Thus, lightly doped impurity regions 20Na of the N-type thin film transistor NT and lightly doped impurity regions 20Pa of the P-type thin film transistor PT are formed. An impurity of phosphorous (P) is injected in the N-type thin film transistor NT at a concentration of $1\times10^{12}/cm^2$ to $1\times10^{13}/cm^2$. On the other hand, an impurity of boron (B) is injected in the P-type thin film transistor PT at a concentration of $1\times10^{12}/cm^2$ to $1\times10^{13}/cm^2$.

Figure 7D:
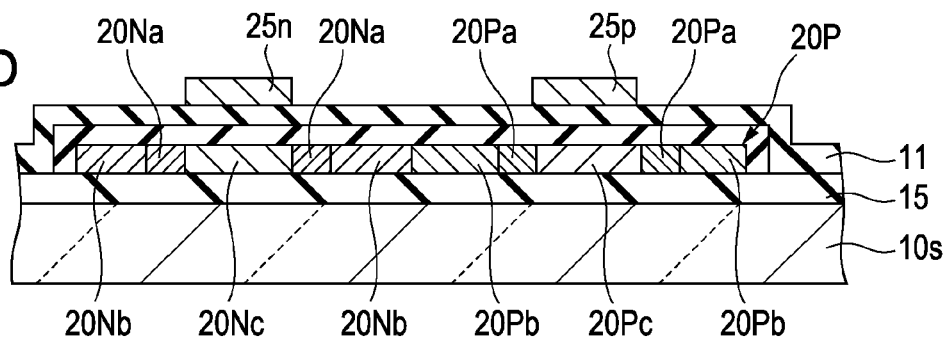

Then, as shown in FIG. 7D, impurities of phosphorous (P) and boron (B) are injected in the N-type thin film transistor NT and the P-type thin film transistor PT, respectively, at a concentration of $1\times10^{15}/cm^2$ while the side wall films (not shown) formed on the side walls of the gate electrodes 25n, 25p are set as masks. Thus, heavily doped impurity regions (source and drain regions) 20Nb of the N-type thin film transistor NT and heavily doped impurity regions (source and drain regions) 20Pb of the P-type thin film transistor PT are formed. It is to be noted that the above impurities may be injected while a photoresist film having a desired shape or the like is set as a mask. Further, the heavily doped impurity regions 20Nb, 20Pb and the lightly doped impurity regions 20Na, 20Pa may be formed by an oblique ion-implantation method while the gate electrodes 25n, 25p are set as masks.

With the above processes, the N-type thin film transistor NT and the P-type thin film transistor PT having a Lightly Doped Drain (LDD) structure are formed. Then, the formed N-type thin film transistor NT and P-type thin film transistor PT are formed such that the heavily doped impurity regions 20Nb, 20Pb thereof are adjacent to each other at some region. That is to say, the N-type thin film transistor NT and the P-type thin film transistor PT are formed such that the source regions and the drain regions thereof are adjacent to each other at some region. A channel region 20Nc of the N-type thin film transistor NT is formed between the lightly doped impurity regions 20Na. A channel region 20 Pc of the P-type thin film transistor PT is formed between the lightly doped impurity regions 20Pa.

Figure 8A:
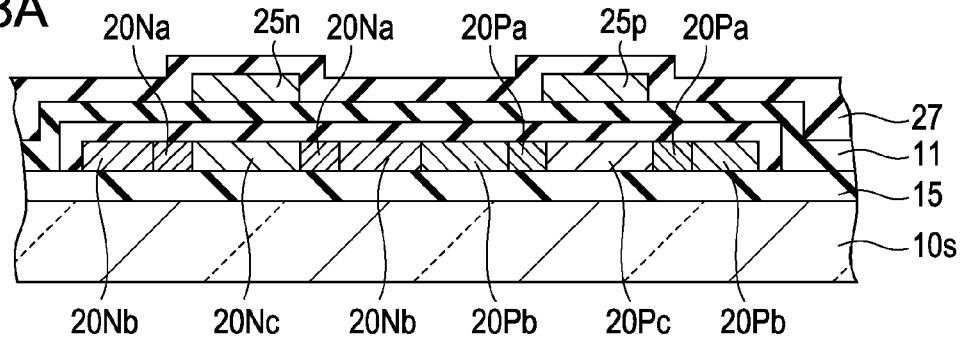
FIGS. 8A to 8D are views illustrating a manufacturing method and a configuration of the thin film transistors.

Then, as shown in FIG. 8A, the interlayer insulation film 27 is deposited and formed on the gate electrodes 25n, 25p. As the interlayer insulation film 27, a silicon oxide film is deposited with a plasma enhanced CVD (PECVD) method for about 300 nm. Thereafter, the interlayer insulation film 27 is subjected to the thermal processing at about 850° C. so as to activate the impurities in the impurity regions 20Na, 20Pa, 20Nb, 20Pb.

Figure 8B:
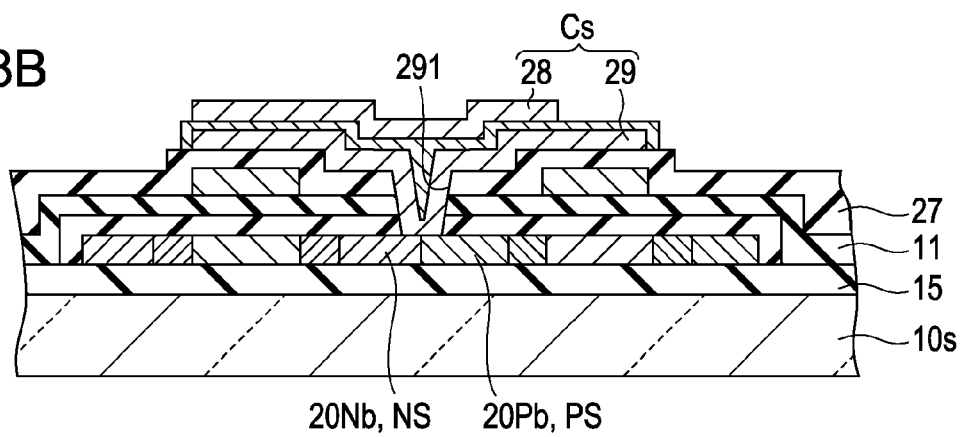

Then, as shown in FIG. 8B, the capacitor electrode 29 and the common electrode 28 forming the pixel capacitor Cs are formed on the interlayer insulation film 27. To be more specific, at first, the interlayer insulation film 27 and the gate insulation film 11 are etched, then, a common contact hole 291 is formed so as to contact both the adjacent heavily doped impurity regions 20Nb, 20Pb. At this time, a region where impurities are doubly injected or a region to which the impurity is not injected is formed in some case in the adjacent heavily doped impurity regions 20Nb, 20Pb. In consideration of such case, the contact hole 291 is formed so as to surely contact both the heavily doped impurity regions 20Nb, 20Pb. That is to say, although the contact hole 291 is formed in a substantially square shape in FIG. 4A, the contact hole 291 is preferably formed in an elongated shape in the direction along the signal line 12.

Then, the conductive film is deposited on the interlayer insulation film 27 including the inner portion of the contact hole 291 for patterning so as to form the capacitor electrode 29. As a result, the heavily doped impurity region 20Nb electrically connected to the capacitor electrode 29 becomes the source region NS of the N-type thin film transistor NT and the heavily doped impurity region 20Pb becomes the source region PS of the P-type thin film transistor PT. The conductive film can be formed with the sputtering method or the like by using a metal such as aluminum (AL) or tungsten (W). Subsequently, in order to form the pixel capacitor Cs, the following films are formed. That is, an insulation film such as a silicon oxide film and a silicon nitride film is formed on a part of the capacitor electrode 29 with the CVD method. Then, the common electrode 28 is formed on the insulation film with the sputtering method or the like by using a metal such as aluminum (AL) or tungsten (W).

Figure 8C:
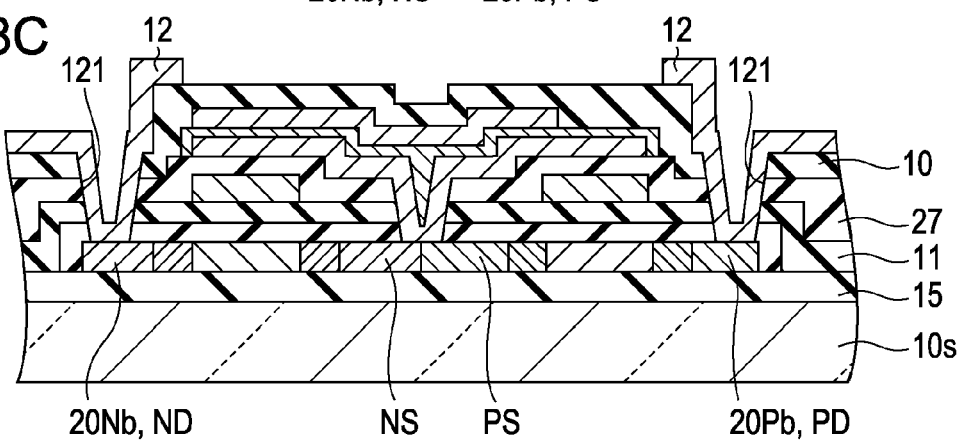

Then, as shown in FIG. 8C, the signal line 12 is formed. To be more specific, at first, the second interlayer insulation film 10 is formed on the common electrode 28 and the interlayer insulation film 27 by depositing the silicon oxide film for 500 nm with the PECVD method, for example. Subsequently, the second interlayer insulation film 10, the interlayer insulation film 27 and the gate insulation film 11 are etched and the common contact hole 121 is formed so as to contact both the adjacent heavily doped impurity regions 20Nb, 20Pb. At this time, a region where impurities are doubly injected or the impurity is not injected is formed in some case in the adjacent heavily doped impurity regions 20Nb, 20Pb. In consideration of such case, the contact hole 121 is formed so as to surely contact both the heavily doped impurity regions 20Nb, 20Pb. That is to say, although the contact hole 121 is formed in a substantially square shape in FIG. 4A, the contact hole 121 is preferably formed in an elongated shape in the direction along the signal line 12.

Then, the conductive film is deposited on the second interlayer insulation film 10 including the inner portion of the contact hole 121 for patterning so as to form the signal line 12. As a result, the heavily doped impurity region 20Nb electrically connected to the signal line 12 becomes the drain region ND of the N-type thin film transistor NT and the heavily doped impurity region 20Pb becomes the drain region PD of the P-type thin film transistor PT. Accordingly, a data signal (voltage) to be written to the pixel capacitor Cs is applied to each of the thin film transistors from the signal line 12.

Figure 8D:
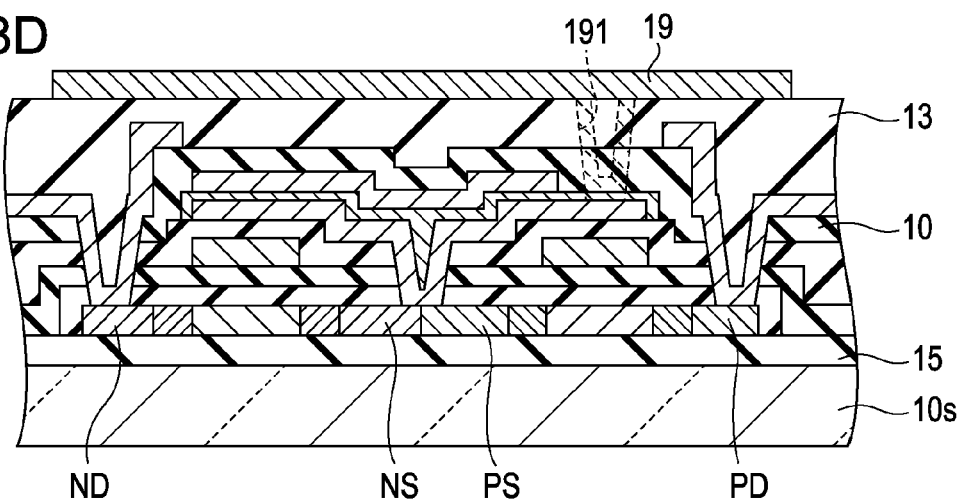

Then, as shown in FIG. 8D, the pixel electrode 19 is formed. To be more specific, the third interlayer insulation film 13 is formed on the signal line 12 and the second interlayer insulation film 10 by depositing the silicon oxide film for 600 nm with the PECVD method, for example. Subsequently, the third interlayer insulation film 13, the interlayer insulation film 27 and the insulation film are etched so as to form the contact hole 191. Then, the conductive film is deposited on the third interlayer insulation film 13 including the inner portion of the contact hole 191 for patterning so as to form the pixel electrode 19.

When the liquid crystal panel 30 is a reflection panel as in the embodiment, for example, the pixel electrode 19 is formed in a film with the sputtering method or the like by using a metal having high reflectivity such as aluminum (AL). Although an oriented film (not shown) made of a polyimide or an organic material is formed on the pixel electrode 19, the silicon oxide film, the silicon nitride film (not shown) or the like is formed on the pixel electrode 19 in some case in order to prevent the pixel electrode 19 from being corroded. It is to be noted that the potential difference between the potential of the pixel electrode 19 and the common potential of the oriented electrode 33 (see, FIG. 1) is applied to the liquid crystal 34 so that an image is displayed.

As described above, in the element substrate 31 as the semiconductor device according to the embodiment, contact holes to be formed are only two with the following configuration. That is, the common contact holes 121, 291 are formed so as to contact both the drain regions and the source regions which are arranged on the adjacent positions so as to be opposed to each other at a part in the two thin film transistors NT, PT constituting the CMOS circuit. As a result, the area occupied by the two thin film transistors NT, PT can be suppressed to be small.

Electronic Equipment

Figure 9:
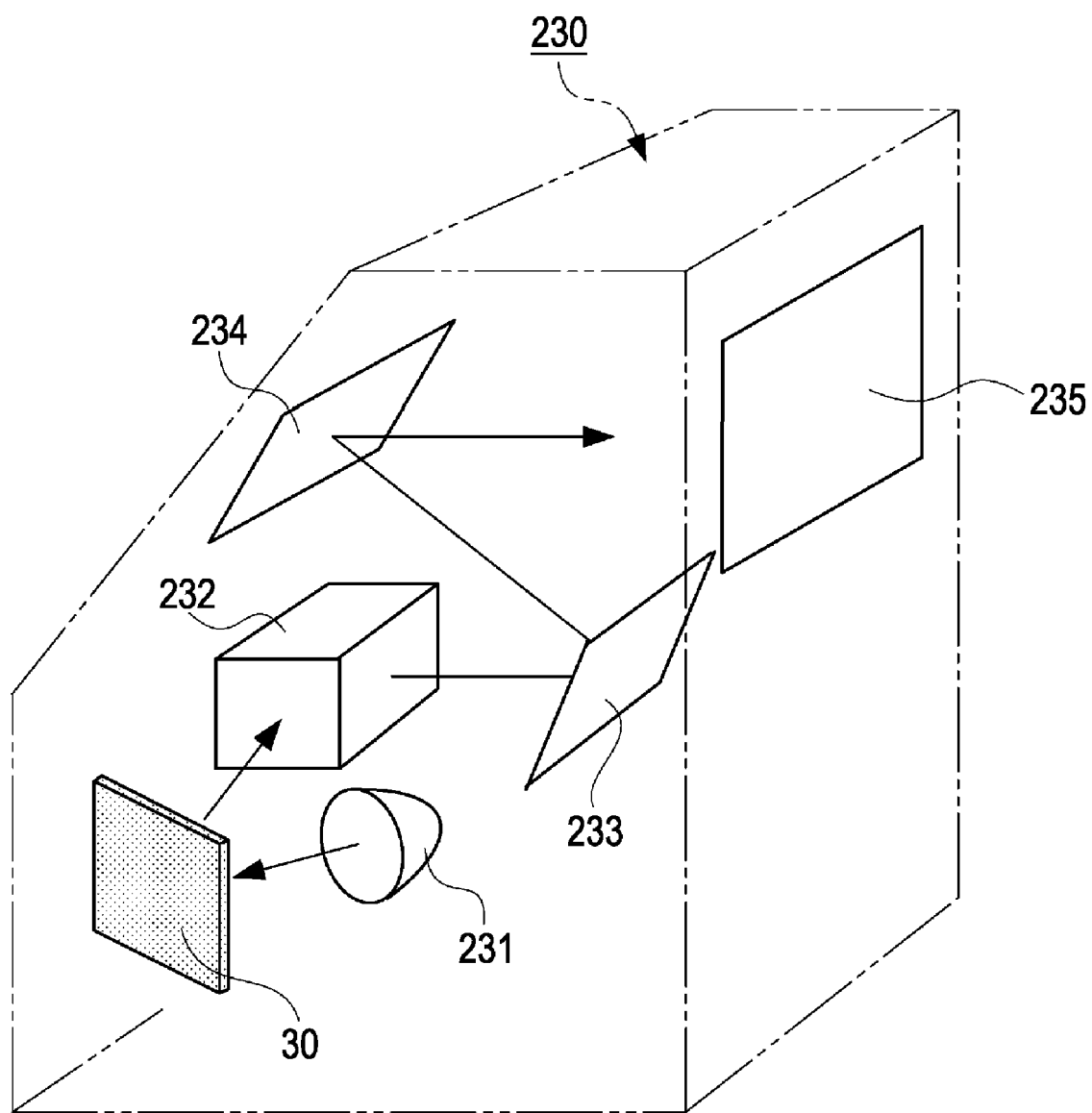
FIG. 9 is a schematic view illustrating a rear projector including the liquid crystal panel.

Next, an example of the electronic equipment including the liquid crystal panel 30 as the electrooptic device according to the embodiment is described with reference to FIG. 9. FIG. 9 is a schematic view illustrating a rear projector including the liquid crystal panel 30.

In a rear projector 230 according to the embodiment, the liquid crystal panel 30 is used as a reflection light valve (LV). To be more specific, the rear projector 230 modulates light supplied from a light source 231 in accordance with the potential applied to the pixel electrode 19 at the time of reflecting the light so as to provide image information. Light beams of the light reflected by the liquid crystal panel 30 are controlled by a optical system 232 and reflected by reflection mirrors 233, 234. Thereafter, an image is formed and displayed on a screen 235.

A high speed responsibility is required in the rear projector 230 in order to display a moving image as in the television or the like. Further, an area occupied by one pixel is required to be small in order to display a high definition image. Accordingly, the liquid crystal panel 30 according to the embodiment in which one pixel has a CMOS circuit configuration and the area occupied by one pixel is suppressed to be small is used. This makes it possible to provide the rear projector 230 by which an excellent high speed responsivity is maintained and a high definition image is displayed.

Second Embodiment

Although the first embodiment has been described, a formation state of the pixel circuit including the CMOS circuit will be described from another viewpoint with reference to the same drawings as in the first embodiment.

In the second embodiment, as shown in FIG. 4A, semiconductor layers constituting the N-type thin film transistor NT and the P-type thin film transistor PT are integrally formed in a circular form. To be more specific, one side of the boundaries of the N-type thin film transistor NT and the P-type thin film transistor PT is set to drain regions (drain region ND and drain region PD). The other side of boundaries of the N-type thin film transistor NT and the P-type thin film transistor PT is set to source regions (source region NS and source region PS).

One contact hole 121 is formed on a boundary portion between the drain region ND and the drain region PD. The drain region ND and the drain region PD are electrically connected together to the signal line 12. On the other hand, one contact hole 291 is formed on a boundary portion between the source region NS and the source region PS. The source region NS and the source region PS are electrically connected together to the capacitor electrode 29. The capacitor electrode 29 is one of electrodes constituting the pixel capacitor Cs. It is to be noted that the capacitor electrode 29 is electrically connected to the pixel electrode 19 through the contact hole 191.

Other configurations are the same as those in the first embodiment and are not repeatedly described.

Hereinbefore, the embodiments of the invention have been described by way of examples. However, the invention is not limited to the examples and it is needless to say that the invention can be made in various modes within a range without departing from a scope of the invention. Hereinafter, the modifications are described.

First Modification

In the above embodiments, the two thin film transistors NT, PT which are formed on the element substrate 31 are arranged such that the gate electrodes 25n, 25p are opposed to each other as shown in FIG. 4A. Therefore, a space between the gate electrodes has to be kept such that the gate electrode 25n is not in contact with the gate electrode 25p, in consideration of a variation in manufacturing. Further, a distance K between regions corresponding to the two thin film transistors NT, PT in the silicon film 20P is undesirably large because the variation between the gate electrodes 25n, 25p and the silicon film 20P is considered. As a result, it is difficult that the space between the scan line 25N and the scan line 25P is made narrow.

Figure 10:
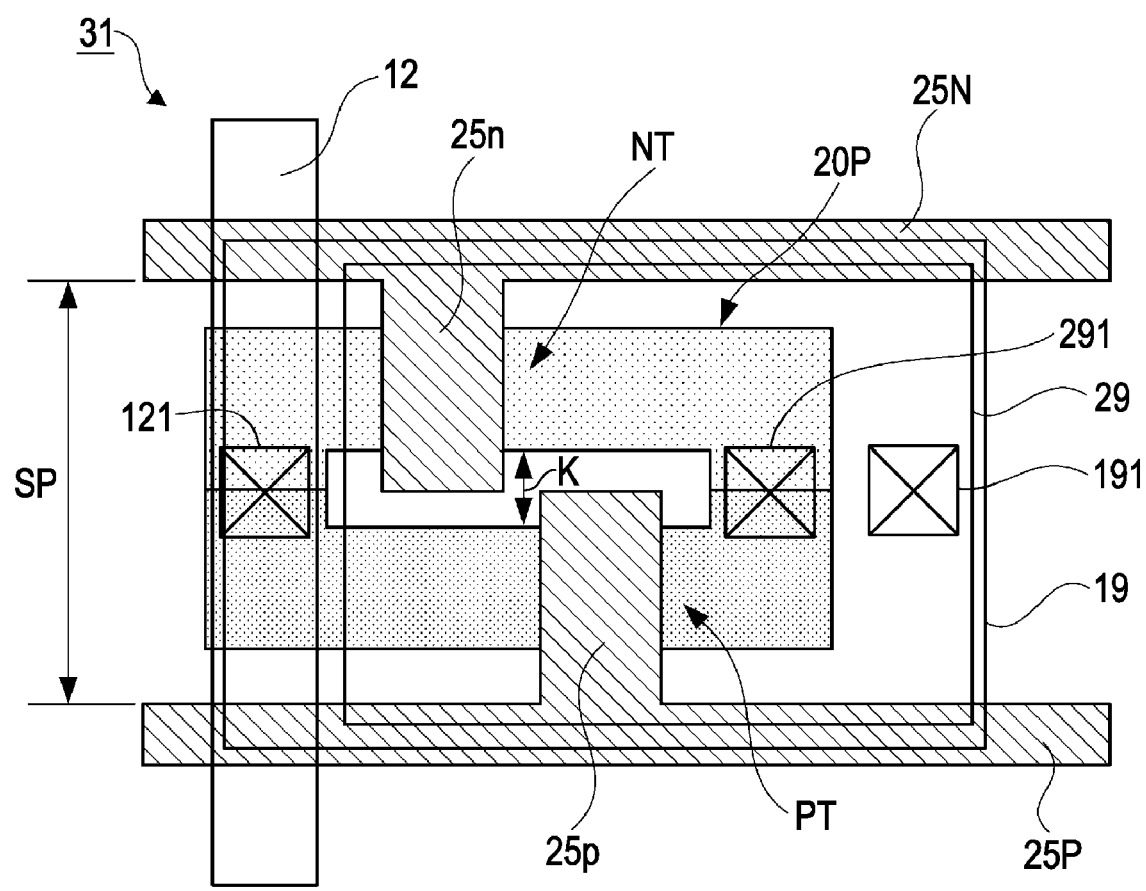
FIG. 10 is a plan view schematically illustrating a formation state of the pixel circuit in a first modification.

As the first modification, the space between the scan line 25N and the scan line 25P may be made narrower by arranging the gate electrodes 25n, 25p so as not to be opposed to each other. The first modification is described with reference to FIG. 10. FIG. 10 is a view corresponding to FIG. 4A in the above embodiments and is a plan view schematically illustrating a formation state of the pixel circuit including the CMOS circuit. Accordingly, like reference numerals designate like components.

As shown in FIG. 10, the gate electrodes 25n, 25p are formed at positions where the gate electrodes 25n, 25p are not opposed to each other by offsetting the gate electrodes 25n, 25p in the direction where the scan line 25 extends. With this configuration, the gate electrodes can be arranged so as to be close to each other as long as the gate electrodes are not contact with the silicon film 20P due to a variation in manufacturing. This is because that the gate electrodes can be arranged without a need to consider a possibility that one gate electrode is in contact with the opposing gate electrode due to a variation in manufacturing. As a result, as shown in FIG. 10, the space K between the formation regions of the two thin film transistors can be narrower. Therefore, the area occupied by the pixel circuit between the scan lines, that is to say, a distance SP between the scan lines of the pixel electrode 19 can be made smaller.

Figure 11:
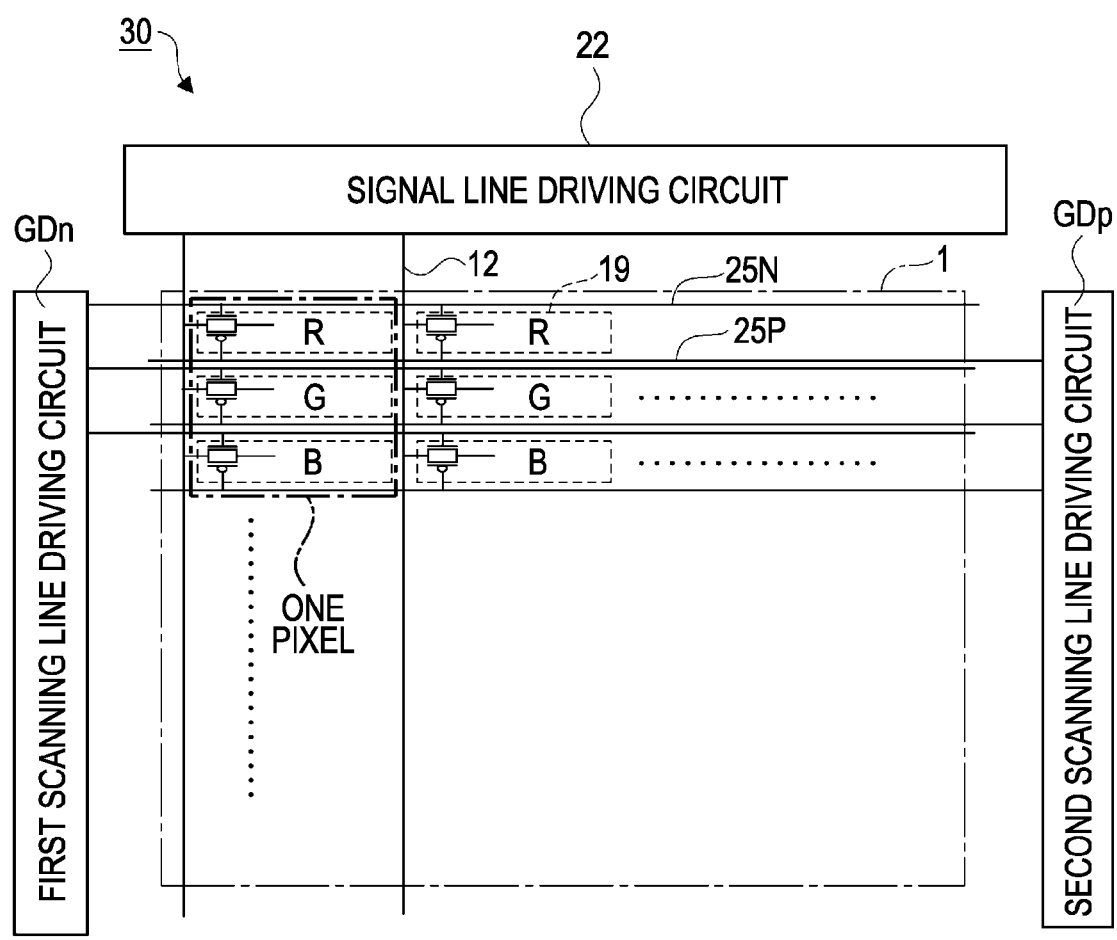
FIG. 11 is a schematic view illustrating a circuit portion relating to driving of pixels in the liquid crystal panel in the first modification.

According to the first modification having such arrangement, the pixel configuration as shown in FIG. 11 can be realized. FIG. 11 is a view corresponding to FIG. 2 in the above embodiments and is a schematic view illustrating circuit portion relating to driving of pixels in the liquid crystal panel 30. Accordingly, like reference numerals designate like components.

As shown in FIG. 11, in the first modification, three pixels arranged in the direction of the signal line 12 are set to sub-pixels of red (R), green (G) and blue (B). These three sub-pixels constitute one pixel in FIG. 11. To be more specific, in the first modification, color filters of red (R), green (G) and blue (B) are formed in the extending direction of the signal line 12 on the opposed substrate 32 (see, FIG. 1) at positions where the color filters are overlapped with the pixel electrodes 19 in a plane. The color filters of red (R), green (G) and blue (B) are repeatedly arranged in parallel in a predetermined order. Therefore, with the arrangement in the first modification, a space between each scan line 25N and each scan line 25P can be narrower. Accordingly, a shape of one pixel constituted by three sub-pixels arranged along the signal line 12 is a square shape which is preferable to display an image while the space along the signal line 12 can be suppressed from being larger. As a result, a small-sized liquid crystal panel 30 on which a high definition color image is displayed can be manufactured.

Second Modification

Figure 12:
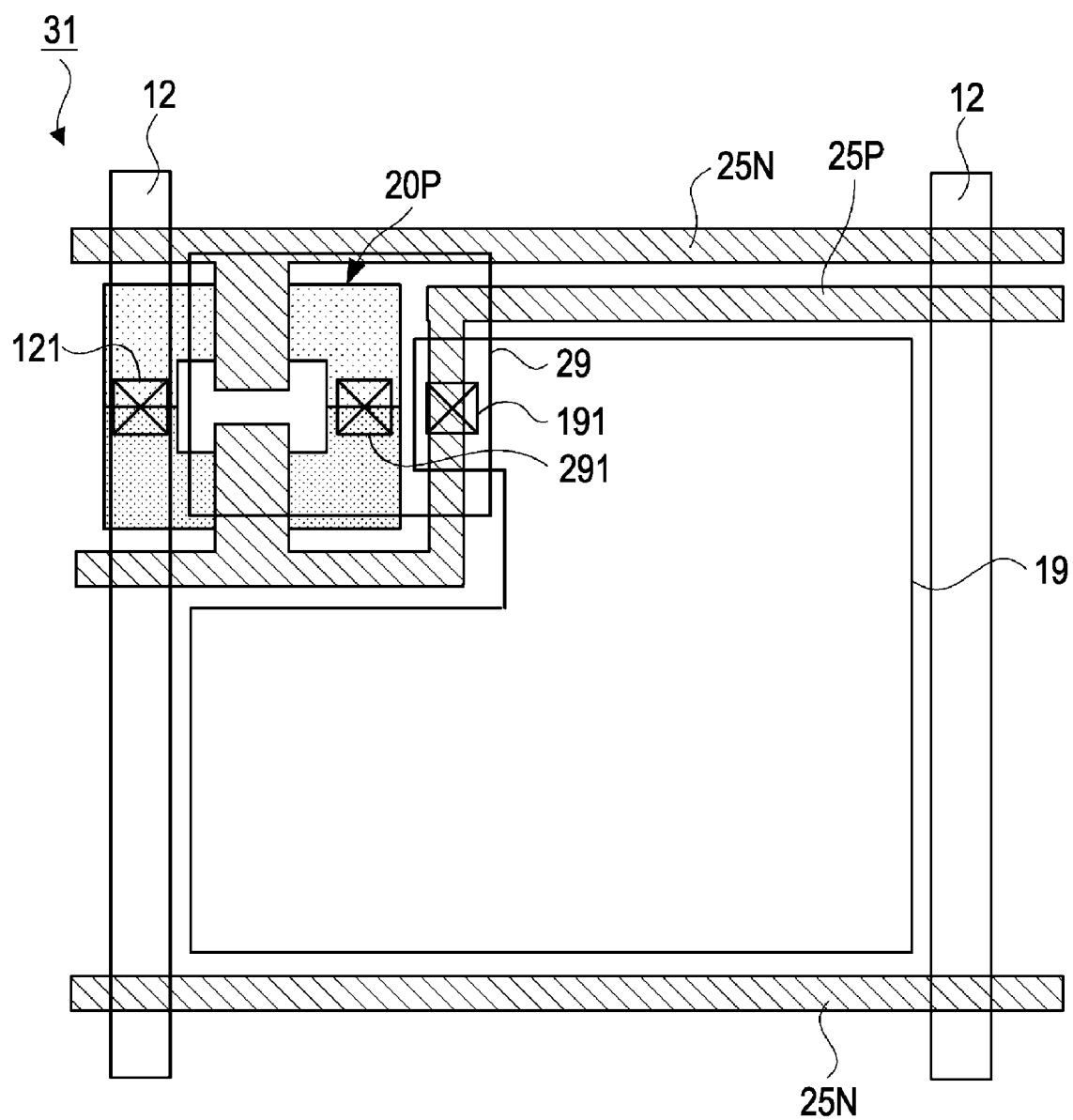
FIG. 12 is a plan view schematically illustrating a formation state of the pixel circuit in a second modification.

In the above embodiments, the liquid crystal panel 30 is a reflection panel. However, the liquid crystal panel 30 is not limited thereto and may be a transmissive panel in which the light is transmitted through the pixel region or a semi-transmissive reflection panel. The semi-transmissive reflection panel has both a reflection region where the pixel region reflects the light and a transmissive region where the light is transmitted through the pixel region. As an example of the second modification, a case where the liquid crystal panel 30 is the transmissive panel is described with reference to FIG. 12. FIG. 12 is a view corresponding to FIG. 4A in the above embodiments and is a plan view schematically illustrating a formation state of the pixel circuit including the CMOS circuit. Accordingly, like reference numerals designate like components.

As shown in FIG. 12, the scan line 25N and the scan line 25P are formed in parallel so as to be adjacent to each other. Further, the scan line 25N and the scan line 25P are wired so as to sandwich the pixel circuit as in the embodiments in a region where the pixel circuit including the CMOS circuit is formed. In the second modification, the pixel electrode 19 which is electrically connected to the capacitor electrode 29 through the contact hole 191 is a transparent electrode (for example, Indium tin oxide). In the second modification, the base 10s of the element substrate 31 is formed with a transparent substrate. Further, the pixel region as a transmissive region through which the light is transmitted is formed on the region of the pixel electrode 19. Regions other than the pixel region are light-shielding regions normally covered by a light-shielding film such as a black matrix.

In the second modification, the area occupied by the CMOS circuit in the pixel circuit can be suppressed to be small. Therefore, the light-shielding region other than the pixel region can be small. As a result, a ratio of the area of the light-shielding region with respect to that of the transmissive region is reduced so that the aperture ratio of the pixel is improved. This makes it possible to provide a liquid crystal panel on which a clear image can be displayed at high definition.

Third Modification

Figure 13:
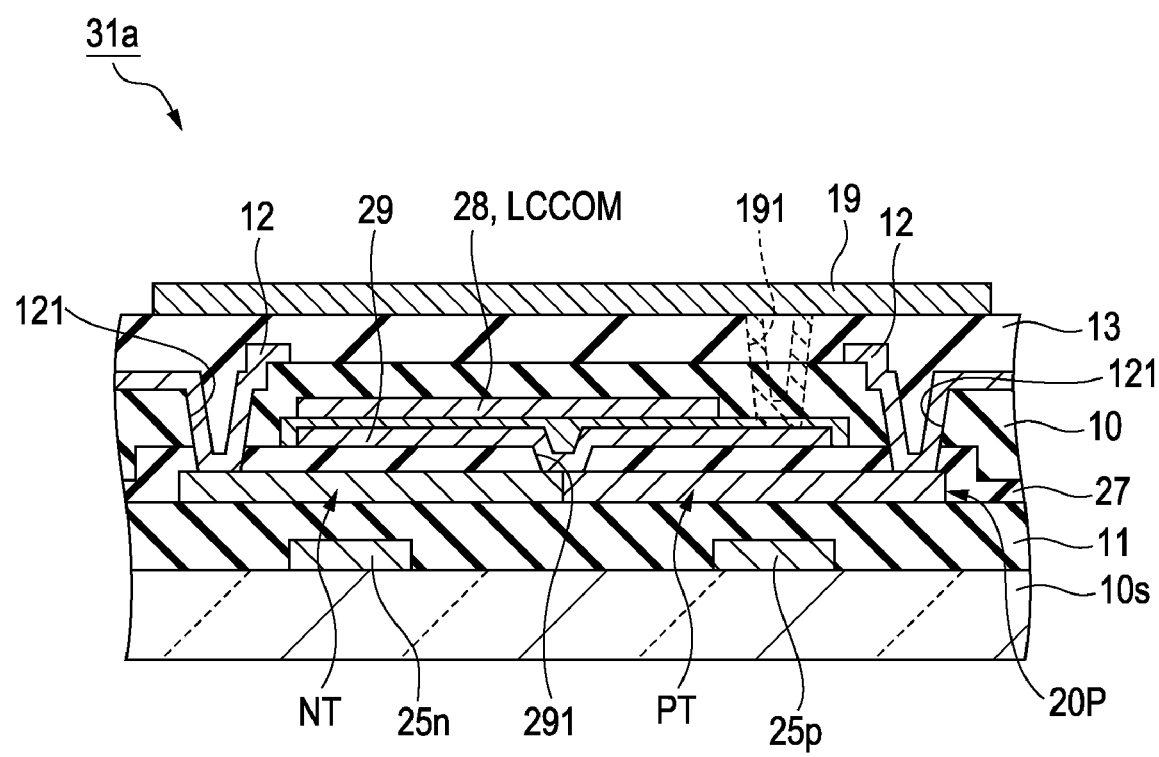
FIG. 13 is a cross-sectional view schematically illustrating a main cross-section of the pixel circuit in a third modification.

In the above embodiments, the two thin film transistors NT, PT are configured as so-called top gate thin film transistors in which the gate electrodes 25n, 25p are positioned on the opposite side to the base 10s with respect to the silicon film 20P. However, it is needless to say that the configuration of the two thin film transistors NT, PT is not limited thereto. For example, the two thin film transistors NT, PT may be configured as so-called bottom gate thin film transistors in which the gate electrodes 25n, 25p are positioned on the side of the base 10s with respect to the silicon film 20P. The third modification is shown in FIG. 13. FIG. 13 is a view corresponding to FIG. 4B in the above embodiments and is a cross-sectional view schematically illustrating a main cross-section of the pixel circuit including a configuration portion of the CMOS circuit. Accordingly, same reference numerals designate the same components.

As shown in FIG. 13, in the element substrate 31a according to the third modification, the gate electrodes 25n, 25p are formed on the base 10s. Then, the gate insulation film 11 is formed on the gate electrodes 25n, 25p and the base 10s and the silicon film 20P is formed on the gate insulation film 11. Processes of forming the two thin film transistors NT, PT thereafter are the same as the above embodiments. With this formation, the area occupied by the CMOS circuit having only two contact holes 291, 121 as connection portions is small as in the above embodiments. Therefore, the transmissive liquid crystal panel which can operate at high speed and display a high definition image can be realized. In the third modification, since impurities cannot be injected to the semiconductor film while the gate electrodes 25n, 25p are set as masks, impurities may be injected by preparing masks instead of the gate electrodes 25n, 25p.

Other Modifications

In the above embodiments, the rear projector 230 as electronic equipment including the liquid crystal panel 30 as an electrooptic device is described. However, it is needless to say that the electronic equipment is not limited thereto. For example, a front projector may be used as electronic equipment. Alternatively, the invention can be applied to electronic equipment such as a portable phone, a video camera, a facsimile machine having a display function, a finder of a digital camera, a portable television, a display device, a PDA, an electronic notebook, an electronic signboard, a billboard display, an identification card and the like. Note that the transmissive liquid crystal panel as described in the above second modification can be applied to the electronic equipment.

In the above embodiments, the element substrate 31 is described as the thin film semiconductor device. However, as is obvious from the above description, other thin film semiconductor devices may be used as long as the thin film semiconductor device is a substrate on which two (or two or more) thin film transistors constituting the CMOS circuit are formed. For example, the thin film semiconductor device may be an element substrate of an organic EL display device. Particularly in the case of the organic EL display device, current driving in which a current in accordance with an image to be displayed is flown through the pixel electrode is performed in some case. However, it is needless to say that the thin film semiconductor device according to the embodiment can be also applied in this case.

The entire disclosure of Japanese Patent Application Nos. 2009-060743, filed Mar. 13, 2009 and 2009-243207, filed Oct. 10, 2009 are expressly incorporated by reference herein.

What is claimed is:

1. A thin film semiconductor device comprising:
a first thin film transistor of which channel is N-type, and
a second thin film transistor of which channel is P-type, wherein:
a source region of the first thin film transistor and a source region of the second thin film transistor are arranged so as to be adjacent to each other in a first region and are electrically connected to a first electrode through one contact hole formed on the first region; and
a drain region of the first thin film transistor and a drain region of the second thin film transistor are arranged so as to be adjacent to each other in a second region and are electrically connected to a second electrode through one contact hole formed on the second region.

2. The thin film semiconductor device according to claim 1, further comprising:
a signal line which is extended in a first directions;
a first scan line which is extended in a second direction, the second direction intersecting with the first direction; and
a second scan line which is extended in the second direction, wherein:
one of the first electrode and the second electrode is a unit electrode formed on a region defined by the signal line and the first scan line and the second scan line or an electrode connected to the unit electrode; and
the other of the first electrode and the second electrode is the signal line.

3. The thin film semiconductor device according to claim 2, wherein:
a gate electrode of the first thin film transistor is electrically connected to the first scan line and a gate electrode of the second thin film transistor is electrically connected to the second scan line; and
the gate electrode of the first thin film transistor and the gate electrode of the second thin film transistor are formed while being offset in the second direction.

4. An electrooptic device comprising:
the film semiconductor device according to claim 3; and
for each pixel, a pixel electrode to which a voltage or a current is applied, wherein:
the electrooptic device displays an image by electrooptic conversion in which a voltage change or a current change is converted to an optical change; and
the unit electrode in the thin film semiconductor device is formed as the pixel electrode.

5. The electrooptic device according to claim 4, wherein:
the pixel is a sub-pixel of which display color is red, green, or blue and which is formed such that the display colors are arranged in a predetermined order in the first direction.

6. The electrooptic device according to claim 4, wherein:
the pixel electrode is a reflection electrode which reflects light.

7. The electrooptic device according to claim 4, wherein one of the thin film semiconductor devices is set as one substrate, an opposed substrate which is arranged so as to be opposed to the one substrate is set as the other substrate, and a liquid crystal layer is held between the one substrate and the other substrate in a sandwiched manner.

8. An electronic equipment comprising the electrooptic device according to claim 4.

9. An electrooptic device comprising:
the film semiconductor device according to claim 2; and
for each pixel, a pixel electrode to which a voltage or a current is applied, wherein:
the electrooptic device displays an image by electrooptic conversion in which a voltage change or a current change is converted to an optical change; and
the unit electrode in the thin film semiconductor device is formed as the pixel electrode.

10. The electrooptic device according to claim 9, wherein:
the pixel is a sub-pixel of which display color is red, green, or blue and which is formed such that the display colors are arranged in a predetermined order in the first direction.

11. The electrooptic device according to claim 9, wherein:
the pixel electrode is a reflection electrode which reflects light.

12. The electrooptic device according to claim 9, wherein one of the thin film semiconductor devices is set as one substrate, an opposed substrate which is arranged so as to be opposed to the one substrate is set as the other substrate, and a liquid crystal layer is held between the one substrate and the other substrate in a sandwiched manner.

13. An electronic equipment comprising the electrooptic device according to claim 9.

14. A thin film semiconductor device comprising:
a first thin film transistor of which channel is N-type; and
a thin film transistor of which channel is P-type,
wherein:
 a source region of the first thin film transistor and a source region of the second thin film transistor are arranged so as to be adjacent to each other in a first region and are electrically connected to a first electrode through one contact hole formed on the first region;
 a drain region of the first thin film transistor and a drain region of the second thin film transistor are arranged so as to be adjacent to each other in a second region and are electrically connected to a second electrode through one contact hole formed on the second region; and
 a semiconductor layer constituting the first thin film transistor and the second thin film transistor are integrally formed in a circular form.

* * * * *